United States Patent [19]

Dahlberg et al.

[11] Patent Number: 5,001,422
[45] Date of Patent: Mar. 19, 1991

[54] VLSI TESTER BACKPLANE

[75] Inventors: Bjorn Dahlberg; Charles H. Schwar, both of Irvine, Calif.; Mauro V. Tegethoff, Fort Collins, Colo.

[73] Assignee: Hilevel Technology, Inc., Irvine, Calif.

[21] Appl. No.: 364,030

[22] Filed: Jun. 9, 1989

[51] Int. Cl.$^5$ ............................................. G01R 31/02
[52] U.S. Cl. ................................. 324/158 F; 324/73.1
[58] Field of Search ................ 324/158 F, 73.1, 158 P

[56] References Cited

U.S. PATENT DOCUMENTS

| | | | |
|---|---|---|---|
| 4,705,447 | 11/1987 | Smith | 324/158 F |
| 4,758,780 | 7/1988 | Coon et al. | 324/158 F |
| 4,862,075 | 8/1989 | Choi et al. | 324/158 F |

Primary Examiner—Ernest F. Karlsen
Attorney, Agent, or Firm—Knobbe, Martens, Olson & Bear

[57] ABSTRACT

An improved design verification system for testing VLSI chips including an outer chassis with access hatches for servicing, removing and installing test circuitry. The chassis additionally incorporates an optics aperture and a manipulator interface which are used in conjunction with other test equipment such as wafer probers. A device-under-test (DUT) board for electromechanically positioning an integrated circuit device is electrically connected directly to a plurality of pin electronics (PE) boards through extended DUT board edge connectors. In addition to the direct DUT/PE boards connection, the PE boards are also directly connected to the backplane assembly through data edge connectors and power edge connectors. The backplane assembly is provided with a backplane board encircled by power boards having receptacles to couple with the data edge connectors and the power edge connectors of the PE boards, and slots through which the extended DUT board edge connectors of the PE boards can project in order to form an electrical connection with the DUT board.

12 Claims, 7 Drawing Sheets

VLSI TESTER BACKPLANE

BACKGROUND OF THE INVENTION

1. Field of the Invention

The present invention generally relates to testers for very Large Scale Integrated (VLSI) circuits and, more particularly, is concerned with a VLSI tester backplane that facilitates the insertion, connection, inspection, test, and removal of a plurality of pin electronics (PE) boards, and a device-under-test (DUT) board, in a design verification system.

2. Description of the Prior Art

A chip is the smallest unit of fabrication in semiconductor technologies. A single chip normally will contain multiple transistors that are connected into more useful entities known as logic gates. Complex chips have many logic gates, forming multiple logic circuits. VLSI chips, a class of chips with exceedingly dense circuitry, can host as many as 10 million transistors per chip, and can embody a number of computational devices on a single chip, including memories and microprocessors.

As presently fabricated, a chip is a thin (0.2 to 0.25 mm) piece of square or rectangular silicon encapsulated in an outer package. This package, for example, a dual inline package (DIP), provides pins that electrically connect the chip to its operating environment, normally a printed circuit board. The pieces of silicon are generally first fabricated as a matrix of dozens or even hundreds of dies that are etched on a large slice of silicon, termed a wafer. After fabrication, the wafer is cut up and the individual dies are packaged into chips. Each die, while still on the wafer, includes electrical contacts that allow electrical signals to be input and output from the die circuitry.

As can be easily imagined, VLSI chips must be tested both during the prototype stages of development and thereafter during mass production, to verify first the integrity of their design, and then the quality of their manufacture. Testing can be performed either prior to or after packaging. Design verification systems have been developed that selectively excite the inputs of an integrated circuit chip with many input combinations, called test vectors. Nearly simultaneously, the outputs of the chip are checked for accuracy. For every test vector, there is an expected output, which is defined by the function performed by the electronic circuitry located within the chip. If there is a discrepancy between the expected output and the actual output when the circuit is presented with a specific test vector, there is likely a design error or, later, a manufacturing error in the chip By testing a large number of input combinations, the likelihood that a design or manufacturing fault in the chip will pass undetected is significantly reduced, if not eliminated.

A typical design verifier used to test prototype chips includes a metallic chassis that holds the electronic circuitry necessary to test a chip, termed the device-under-test (DUT). The circuitry undergoing testing is typically mounted on a printed circuit board that electromechanically positions the integrated circuit device such that the pins of the chip can be connected to the test circuitry in the chassis. This circuit board, generally known as a DUT board, also functions to maintain a controlled impedance signal path from the test electronics to the chip pins. This is normally accomplished by providing paths of near equal length for electrical signal travel. The DUT board is also normally removable, so that removable connecting wires can be easily placed between the chip pins in the center of the board and the input/output (I/O) stimulus connections on the periphery of the board.

The I/O stimulus connections on the DUT board are sometimes connected to the electronics of the testing circuitry by raised pins located on a test platform, (which is frequently referred to as load board), that is located on an outer surface of the chassis. For example, the invention disclosed by Schwar, et al., (U.S. Pat. No. 4,782,289) is illustrative of such a load board. The load board is securely fastened to the chassis, and supports the DUT board when it is in place on the design verifier. The load board also functions as a backplane, channeling electrical test signals and power from the underlying pin electronics (PE) boards to the DUT board.

The PE boards carry the test electronics circuitry used to stimulate the DUT, and then to compare the actual resultant signals with expected results. Pin driver circuits supply the proper voltages and timing for the DUT pins, and compensate for signal distortion and noise disturbances. The proper driver information, such as voltage level, is encoded as digital test vectors stored in random access memory (RAM) on the PE boards. The PE boards further contain receivers and output comparators. The pin outputs are thereby received and compared against the expected outputs stored in RAM. The PE boards are typically connected to the load board using edge connectors located on the PE boards and fitting them into edge connector receptacles located on the load board.

In some design verifiers a provision is made to allow the verifier to be connected directly to a die held in a wafer prober. A wafer prober is a device that accurately positions wafer dies such that I/O contacts on the die are accessible for probing. A typical wafer prober comes with a microscope to allow an operator to connect a DUT board to the wafer at the desired die contacts through a connecting or top hat assembly. If a design verifier is mated with a wafer prober, then testing can be performed on the chip prior to encapsulation, thus saving large amounts of time and expense.

Mating a design verifier and a wafer prober is accomplished by placing the design verifier, typically a large and heavy machine, on a manipulator. A manipulator is a crane-like device used to hoist and position the heavy and bulky verifier chassis filled with electronics. The manipulator allows a special wafer prober DUT board to be positioned adjacent to a wafer prober and locked thereto with a docking plate.

There are at least two accepted mechanisms known in the prior art for arranging the entire set of abovementioned boards in a design verifier chassis. In the first, the DUT board is clamped to the load board with a plurality of PE boards within the chassis and underlying the load board. Thumbscrews located about the periphery of the DUT board are typically screwed through the DUT board and into a number of threaded bores formed in the load board to hold the DUT board stationary. The second arrangement of verifier boards replaces the thumbscrews with a clamping frame, as disclosed by Schwar, et al. In this arrangement, a ringlike frame with a hinge is raised to accept the DUT board, which is inserted between the ringlike frame and the load board. The ringlike frame also includes a latch to clamp the DUT board to the load board, with the PE boards again underlying the load board.

The two board configurations discussed above share some common problems. In both board configurations, electromechanical couplings are required between the PE boards and the load board, and between the load board and the DUT board. This double connector signal path permits, or provides, an enhanced opportunity for undesirable noise disturbances to be combined with the electrical signals channeled down the path. The intermediate position of the load board also makes for more difficult access to the underlying PE boards. Other problems are unique to each configuration.

The thumbscrew configuration uses compressible pins to maintain a selected amount of space between the two boards. When installing a DUT board on a load board, it is desirable to depress each of the compressible pins by an equal amount, achieving a uniform electrical contact between the heads of the I/O pins and their related contact points on the DUT board. However, with a plurality of thumbscrews there can be no assurance that each of the thumbscrews has been screwed into the load board to the same extent. In point of fact, the screws will generally not be uniformly tightened, causing non-uniformities in electrical contact. Some I/O pins may even fail to make contact with the DUT board, resulting in false indications of design or manufacturing errors during testing of the chip.

In addition, the use of multiple removable thumbscrews increases the risk of physical damage to the sensitive underlying electronics. For example, if an inadvertently dropped thumbscrew falls into the verifier chassis and makes contact with one or more electrical paths, a conducting bridge formed thereby could cause a damaging short circuit.

The Schwar, et al., positioning frame, although providing a better connection between a DUT board and a load board, tends to impair access to the PE boards. When the load board is removed to service the PE boards, the adjacent PE boards may be cracked or broken. Furthermore, the positioning frame configuration of Schwar, et al., provides no manipulator interface. Naturally then, direct die testing is difficult.

In summary, design verification systems generally require the careful alignment and mating of three types of electronics boards "stacked" on top of each other from top to bottom as follows: a DUT board on top, a backplane (or load board), and a plurality of underlying PE boards. Past solutions to configuring these boards have resulted in two serious disadvantages. First, signal integrity between the DUT board and the PE boards has suffered since signals have been channeled by electromechanical connectors through the intermediate signal path defined by the backplane Second, maintaining the PE boards without causing short circuits or breaking connectors has been an extraordinary achievement. Therefore, a need exists for improvements in VLSI device testers of a nature that will result in enhanced electrical signal integrity, ease of maintenance, and the ability to provide for manipulator and wafer prober interfacing.

SUMMARY OF THE INVENTION

The present invention provides a VLSI tester backplane designed to satisfy the aforementioned needs. Signal integrity is dramatically improved by configuring the electronics boards to facilitate a direct signal path between the PE boards and the DUT board. In the present invention, digital signals and power are distributed among the PE boards by the backplane using electromechanical edge connectors, as before. However, the PE boards are modified to include additional extended edge connectors that project through conjoining backplane slots to mate with the DUT board. Hence, digital signals and power may be conducted directly between the PE boards and the DUT board. It follows, of course, that the cleaner electrical signals provided by this direct signal path lead to more accurate testing.

Additionally, the previous problem associated with removing the backplane to access PE boards, (i.e., the breakage of adjacent PE boards), has been eliminated. The present invention mounts the electronics boards inside a chassis having removable hatches on the end opposite the DUT board. The PE boards may thus be slidably removed from retaining board guides and out the hatch apertures, without disturbing the backplane or the DUT board. The internal electronics of the VLSI tester can thereby be more easily maintained and serviced.

Further, the present invention provides an interface location for a manipulator, permitting the DUT board to be oriented in many directions. This capability is especially powerful when combined with the central chassis aperture of the present invention. The combination of these features allows a wafer prober microscope to examine wafer wiring for testing of the unencapsulated die. The verification system is additionally designed to interface with nonintrusive E-beam and laser beam systems, such as the Mitsui Data Probe Model 2010 IC Logic Laser Analyzer, and radiation source chambers.

Accordingly, the present invention relates to an apparatus for joining a plurality of PE boards to a DUT board in a design verification system for testing integrated circuits. The present invention comprises a DUT board for electromechanically positioning an integrated circuit device, a backplane for routing electrical signals amongst the various PE boards, and PE boards having edge connectors used to electromechanically connect the PE boards directly to edge connector receptacles affixed to the DUT and backplane boards. The resulting assembly eliminates the noise associated with previous assemblies that made use of indirect connections between the PE boards and the DUT board.

The printed circuit boards are housed in a chassis that has an optics aperture, which is necessary for viewing the placement of connections on a semiconductor wafer, and also a manipulator interface to allow the DUT board to be oriented in any desired direction. The chassis includes a docking plate that is used to lock other test analysis equipment to the chassis. The chassis further includes bottom access hatches through which PE boards can be serviced, installed and removed without disrupting or damaging other printed circuit boards.

These and other objects and features of the present invention will become more fully apparent from the following description and appended claims taken in conjunction with the accompanying drawings.

DESCRIPTION OF THE PREFERRED EMBODIMENTS

Reference is now made to the drawings wherein like parts are designated with like numerals throughout.

Figure 1:
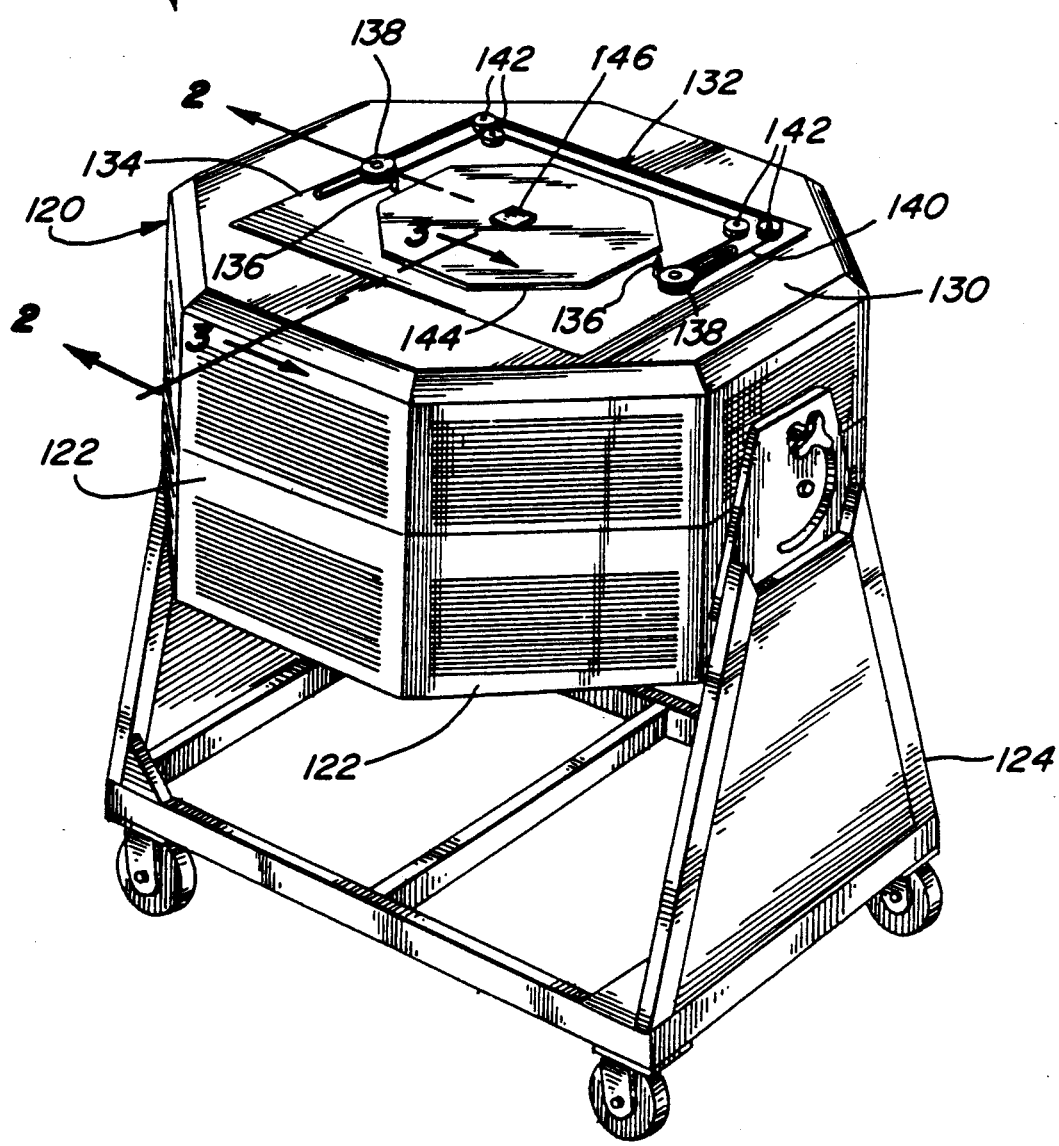
FIG. 1 is a perspective view of a preferred embodiment of a design verification system mounted on a movable platform.

A design verification system 100 for testing Very Large Scale Integrated (VLSI) circuits is shown in FIG. 1. The design verification system 100 includes a tester chassis 120 that contains the electronic circuitry and software necessary to test VLSI chips and similar integrated circuits. In a preferred embodiment, the tester chassis 120 is fabricated from sheet metal into a drum-like shape having the following approximate dimensions: 22 inches height by 40 inches diameter. The tester chassis 120, according to such preferred design, is octagonal in horizontal cross-section and has a plurality of vertical rectangular chassis sidewalls 122. Printed circuit boards containing electrical components for circuit testing, and housed in the tester chassis 120, (not shown in FIG. 1), are divided among eight equivalently sized, pie-shaped compartments (not shown) with each pie-shaped compartment having a base defined by one of the chassis sidewalls 122. The tester chassis 120 may be pivotally secured on a portable chassis stand 124, permitting the tester chassis 120 to be rotated to a convenient working position. In actual operation, the tester chassis 120 is connected by a digital data bus (not shown), to a conventional microcomputer controller (not shown), which provides a man-machine interface for controlling and monitoring the design verification system 100.

A docking frame 130 is bolted to the top of the tester chassis 120. The docking frame 130 as shown in FIG. 1, is an octagonal metallic plate having a rectangular, docking frame cut-out or window 132, in the center thereof. The dimensions of the docking frame 130 and docking frame window 132, in one preferred embodiment are as follows the docking frame 130 is 40 inches (1.02 m) in diameter and the docking frame window 132 is 26.5 inches by 19.5 inches The docking frame 130 serves as a protective and cosmetic covering for the electronics enclosed in the tester chassis 120. The docking frame window 132 is provided to permit easy access to the interior portions of the tester chassis 120, with an easily removable docking plate 134 received therein as a cover.

The docking plate 134 is a rectangular metallic plate having a circular docking plate window (not shown), and in a preferred embodiment, the docking plate window has a diameter of about 4 inches. The docking plate 134 also has seven rectangular slots (not shown) arranged radially about the docking plate 134 center, corresponding to seven of the eight pie-shaped electronics compartments, and hence allowing chassis electronics to extend outward from the top of the chassis 120 so as to mate with a device under-test (DUT) board 144. To facilitate alignment between the tester chassis 120 and other test equipment (not shown) a pair of docking pins 136 are located on the docking plate 134, and are in turn accepted into recesses located on such other test equipment.

Securement of other test equipment can be obtained through a pair of docking cam levers 138 that are interconnected by a twisted wire cable 140 threaded between a set of four docking pulleys 142. The connection between the pair of docking cam levers 138 is such that movement of one docking cam lever 138 causes movement of the other locking cam lever 138, through movement of the twisted wire cable 140. The docking of test equipment, such as a wafer prober (not shown), with a design verification system, will be familiar to those skilled in the technology.

The DUT board 144 projects above the surface of the docking plate 134, and is centered over the circular window (not shown) in the docking plate 134. The DUT board 144 rests on a plurality of edge connectors (not shown) located on printed circuit boards (not shown) that extend out of the top of the chassis 120. As shown in FIG. 1, the DUT board 144 functions to receive and position a VLSI chip 146, or other device-under-test, on the tester chassis 120. The DUT board 144 also serves to electromechanically connect the test electronics housed in the tester chassis 120 to the VLSI chip 146.

Figure 2:
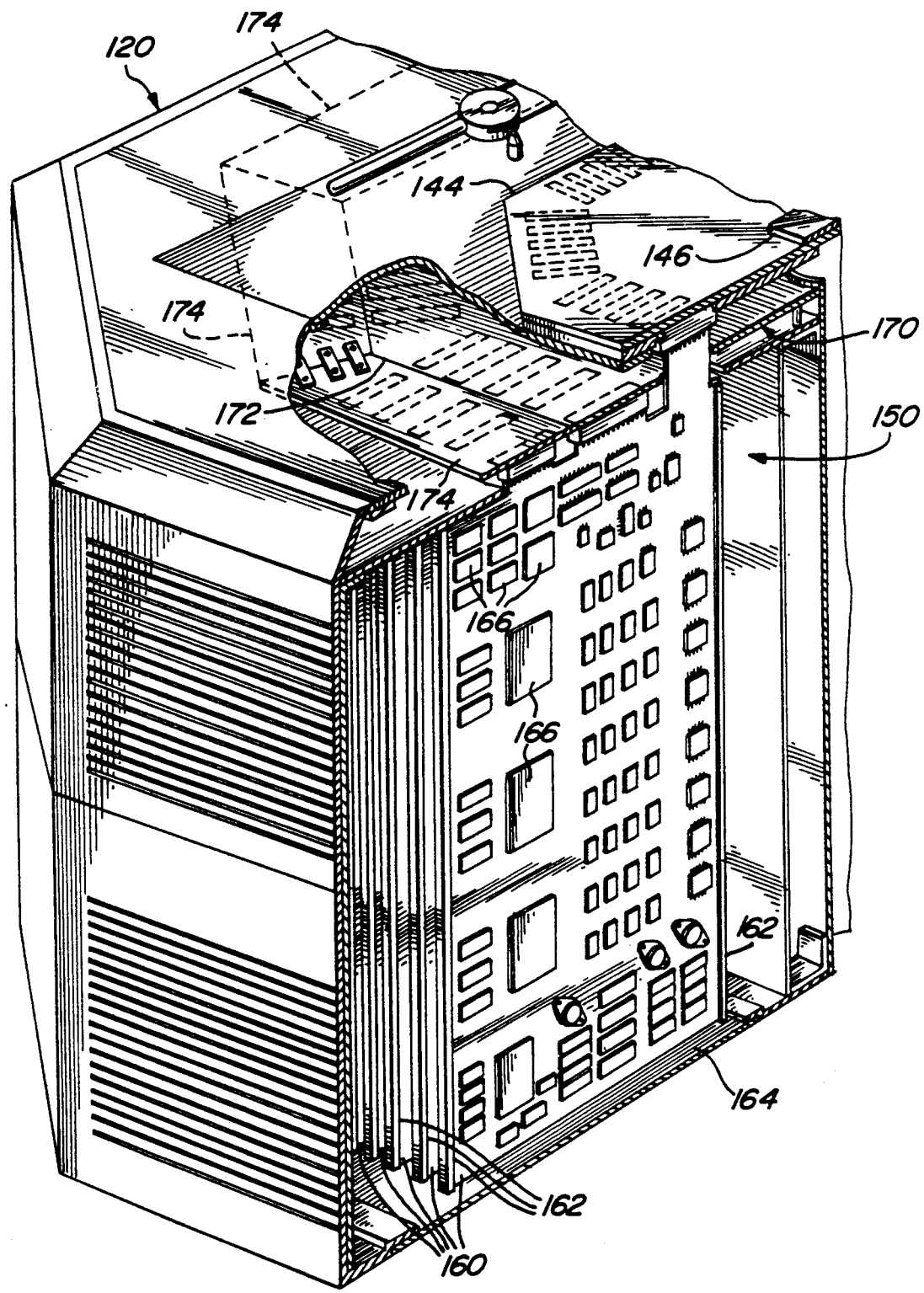
FIG. 2 is a partial perspective view in section taken along line 2—2 of FIG. 1, with portions broken away and portions shown in phantom, showing a plurality of pin electronics boards mounted inside a design verification system chassis.

In FIG. 2, a sectional view of one pie-shaped compartment in the chassis 120 reveals the principal electromechanical connecting components and the manner of forming the various connections relied upon in the tester chassis 120 according to the present invention. A plurality of pin electronics (PE) boards 160 are shown slidably received in a plurality of board guides 162. A plurality of access hatches 164, are formed on the bottom of the chassis 120 adjacent to the PE boards 160, preferably one access hatch 164 per compartment. Any particular PE board 160 can thus be readily accessed from the bottom of the tester chassis 120 by removing the appropriate access hatch 164, such as by unscrewing fastening bolts, (not shown), and sliding the PE board 160 out from its board guides 162.

The pin electronics (PE) boards 160 are so named because the electronic circuitries hosted by the boards 160 drive the input/output (I/O) pins of the VLSI chip 146 with digital signals, and "listen" for the expected digital responses. The plurality of PE chips 166 on the PE boards 160 include driver, receiver, comparator and memory circuitries. More specifically, the digital circuitry embodied by the plurality of PE chips 166 tests the VLSI chip 146 by applying properly shaped and timed signals to certain pins of the VLSI chip 146 via the DUT board 144.

In a preferred embodiment, each pie-shaped compartment houses five PE boards 160. In two preferred configurations based on this embodiment, PE boards 160 are housed in either of four or seven of the eight available compartments. Thus, in one preferred configuration, twenty PE boards 160 are housed in four compartments and, in addition, four power supplies are positioned inside the remaining compartments in the chassis 120. In a second preferred configuration, thirty-four PE boards 160 are housed inside the chassis 120, (one PE board position is reserved for DUT power) and the system power supplies are external to the chassis 120. Since, in the preferred embodiment, each PE board 160 can control sixteen DUT pins, the first PE board configuration supports DUTs having up to 320 pins, and the second PE board configuration supports DUTs having up to 544 pins.

The top of each PE board 160 is connected to a backplane assembly 170 and the multi-layer DUT board 144. The backplane assembly 170 comprises an octagonal backplane board 172 surrounded by a plurality of connected trapezoidal power boards 174. Communications between individual PE boards 160 is accomplished by transmitting digital signals along conductive paths etched into the backplane board 172. Power is supplied to the PE boards 160 by the power boards 174, which encircle the backplane board 172.

Figure 3:
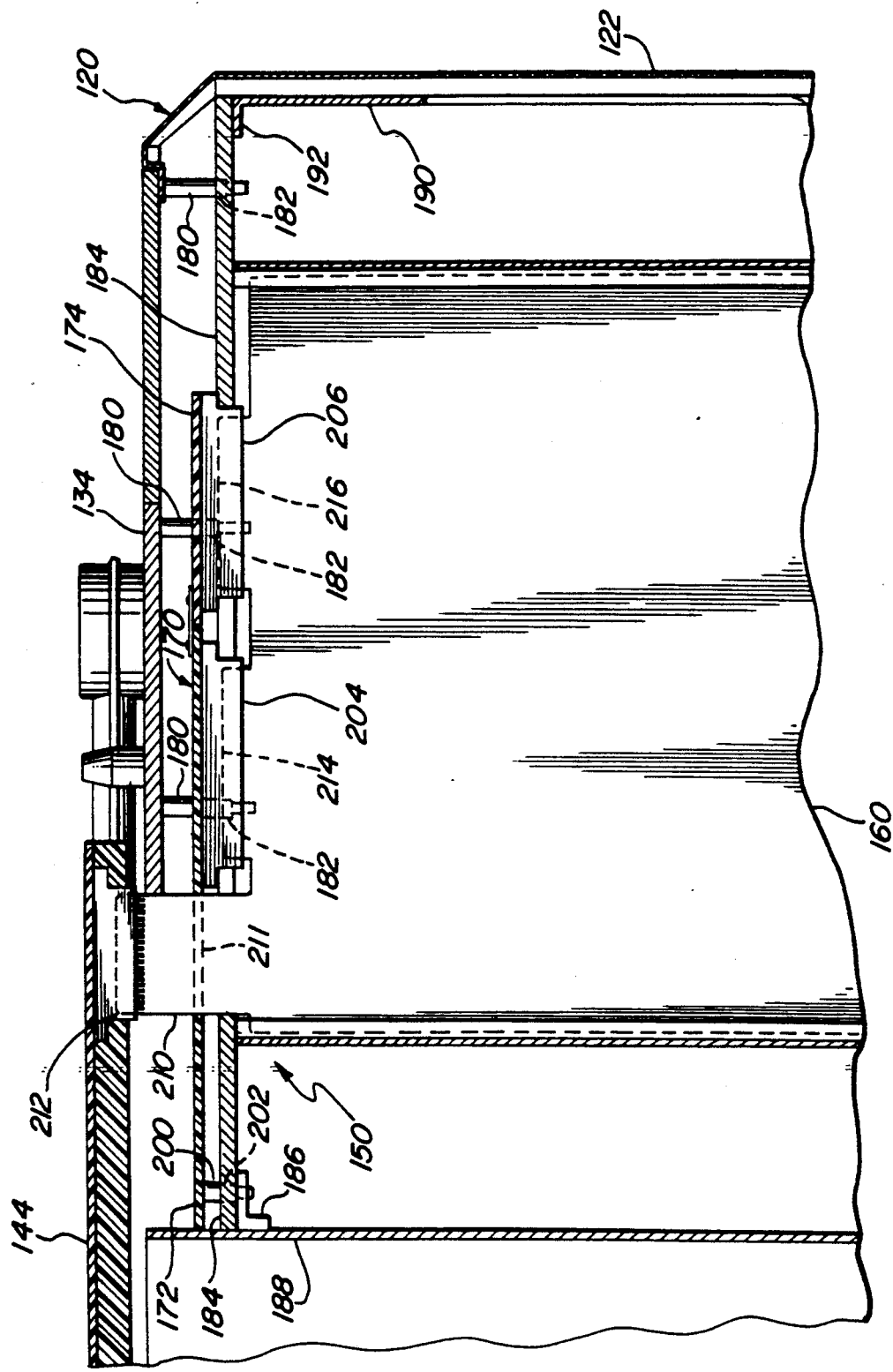
FIG. 3 is a partial side elevational view in section, taken along line 3—3 of FIG. 1, with portions shown in phantom, showing the electromechanical elements, including printed circuit boards, of a preferred embodiment of the present invention.

The docking plate 134, as shown in FIG. 3, is supported by a plurality of docking plate standoffs 180. The standoffs 180 fit into a plurality of docking plate standoff recesses 182 located in a horizontal chassis support platform 184. The chassis support platform 184, is preferably an octagonal metal plate having a circular aperture. The chassis support platform 184 is bolted in its center to a ring bracket flange 186 affixed to a microscopy tube 188. The axis of the microscopy tube 188 is collinear with an axis through the center of the circular aperture in the chassis support platform 184, and extends the entire height of the chassis 120. In addition, the periphery of the support platform 184 extends to the outer sidewalls 122 of the tester chassis 120. Each outer sidewall 122 is in fact fabricated in a manner having an inner sidewall 190 that is bent inward and terminates at a top distal end to form an inner sidewall flange 192. The chassis support platform 184 rests on the inner sidewall flange 192, which provides increased structural rigidity thereto.

The backplane board 172 and the power boards 174 of the backplane assembly 170 sit immediately above the chassis support platform 184. In a preferred embodiment, the backplane assembly 170 is roughly the same diameter as the tester chassis 120. A plurality of backplane standoffs 200 are affixed to the backplane assembly 170, and fit into backplane standoff recesses 202 located in the chassis support platform 184.

A set of backplane data connector receptacles 204 comprises additional components which are attached to the backplane board 172 and located about a central diameter thereof. Additionally, the data connector receptacles 204 are arranged radially about a central region of the backplane board 172. A set of backplane power connector receptacles 206 is attached to the power boards 174, with the individual power connector receptacles 206 also located about a central diameter of the backplane assembly 170, at a greater radial distance than the backplane data connector receptacles 204.

Each PE board 160 has a DUT board edge connector 210 which extends through one of a plurality of edge connector slots 211 in the backplane board 172 and into one of a plurality of DUT board connector receptacles 212 attached to, and adjacent to, a peripheral edge of the DUT board 144. A backplane data edge connector 214 is formed in the PE board 160, at a location designed to permit the data edge connector 214 to slide into and be received by one of the backplane data connector receptacles 204. A backplane power edge connector 216 is similarly formed in and located on the PE board 160 at a location that permits the backplane power edge connector 216 to slide into and be received by one of the backplane power connector receptacles 206 located on the power boards 174.

Figure 4:
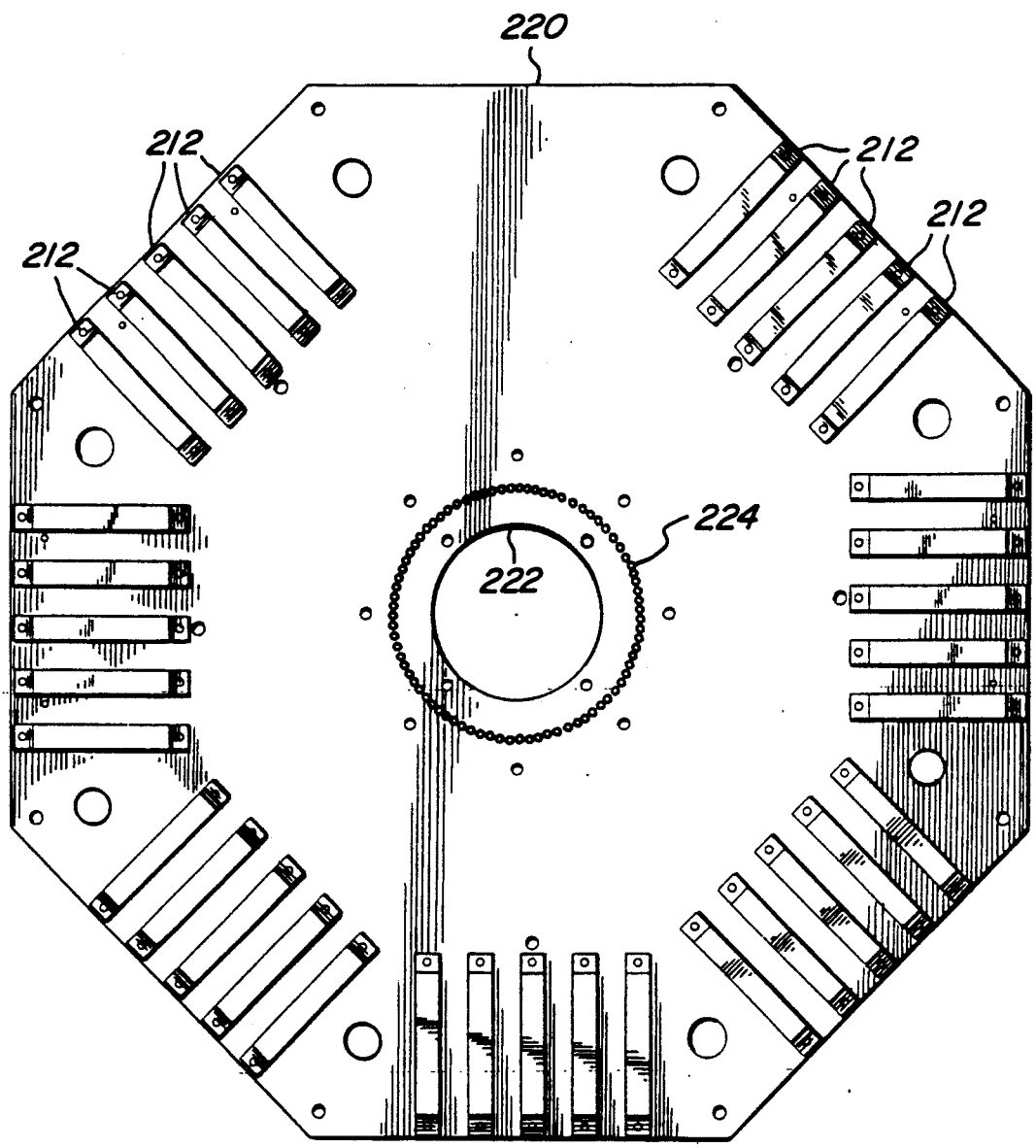
FIG. 4 is a bottom plan view of one type of device-under-test board.

FIG. 4 shows the bottom side of an adapter DUT board 220. The adapter DUT board 220 differs from the previously discussed DUT boards 144 (FIGS. 1-3) in that it cannot directly host a VLSI chip. Rather, the adapter DUT board 220 piggybacks a "daughter" DUT board (not shown) that in fact hosts the chip. For example, the adapter DUT board 220 allows the design verification system 100 to connect with a sixty pin circular DUT board manufactured by Schlumberger Technologies of San Jose, Calif. for the Sentry ATE Systems (not shown). Other adapter DUT boards can connect to DUT boards manufactured by electronic test equipment vendors such as, for example, Ando Corp. of Sunnyvale, Calif., and Trillium of San Jose, Calif. Adapter boards thus provide the flexibility to adapt a broad variety of DUT boards that are presently being used in the design verification industry for use with the present design verification system 100.

The adapter DUT board 220, as shown in FIG. 4, includes thirty-five DUT board connector receptacles 212 attached thereto, enough to support a 560 bit chassis configuration. Each receptacle 212 can be used to form a connection with a sixteen bit data bus located on a PE board (not shown). When configured as a 320 bit chassis, the fifteen receptacles 212 at the base of the adapter DUT board 220 are not used, and instead power supplies occupy the corresponding compartments inside the chassis 120. In either case, the adapter DUT board 220 is provided with a centrally located DUT board aperture 222 that allows a microscope (not shown) to access the wiring underneath a DUT daughter board (not shown), which is in turn surrounded by a circular array of daughter board pin apertures 224 with sixty (60) shown in FIG. 4.

Figure 5:
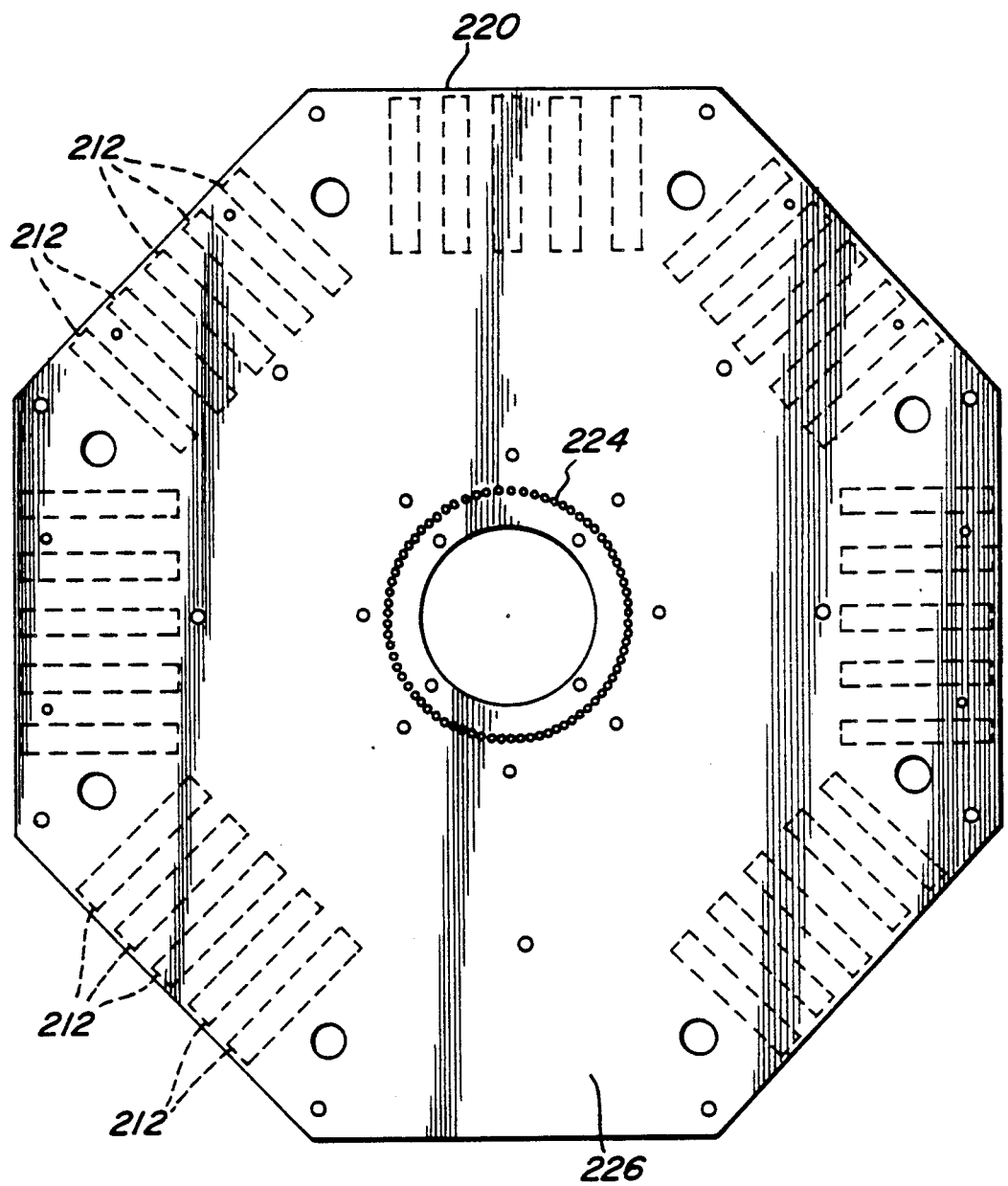
FIG. 5 is a top plan view, with portions shown in phantom, of the device-under-test board shown in FIG. 4.

Referring now to FIG. 5, there is shown the top side of the adapter DUT board 220 shown in FIG. 4. The DUT board connector receptacles 212 affixed to the bottom side of the board 220 are shown in phantom. One type of daughter board in present use is a circular board manufactured by Schlumberger (not shown), and that connects to the adapter DUT board 220 by a plurality of pogo pins (not shown) that are received by the pin apertures 224. A power input edge 226 is formed on one of the octagonal edges of the DUT board 220, and is reserved for inputs from an external power supply. The DUT boards 144, 220 use micro-strip techniques to maintain a controlled impedance signal path. In microstrip technology, a clean signal path results from separating one or more signal layers from the ground layer with a nonconductive layer.

DUT boards manufactured in accordance with the present invention may be provided in a number of embodiments to support different types of devices, such as a chip or a wafer, and to support adaptation to other vendor boards However, it is presently contemplated that all such DUT boards will support at least 320 programmable I/O pins driven by twenty PE boards 160—although it is recognized that future progress in the design of computers may require some changes at some future date.

Figure 6:
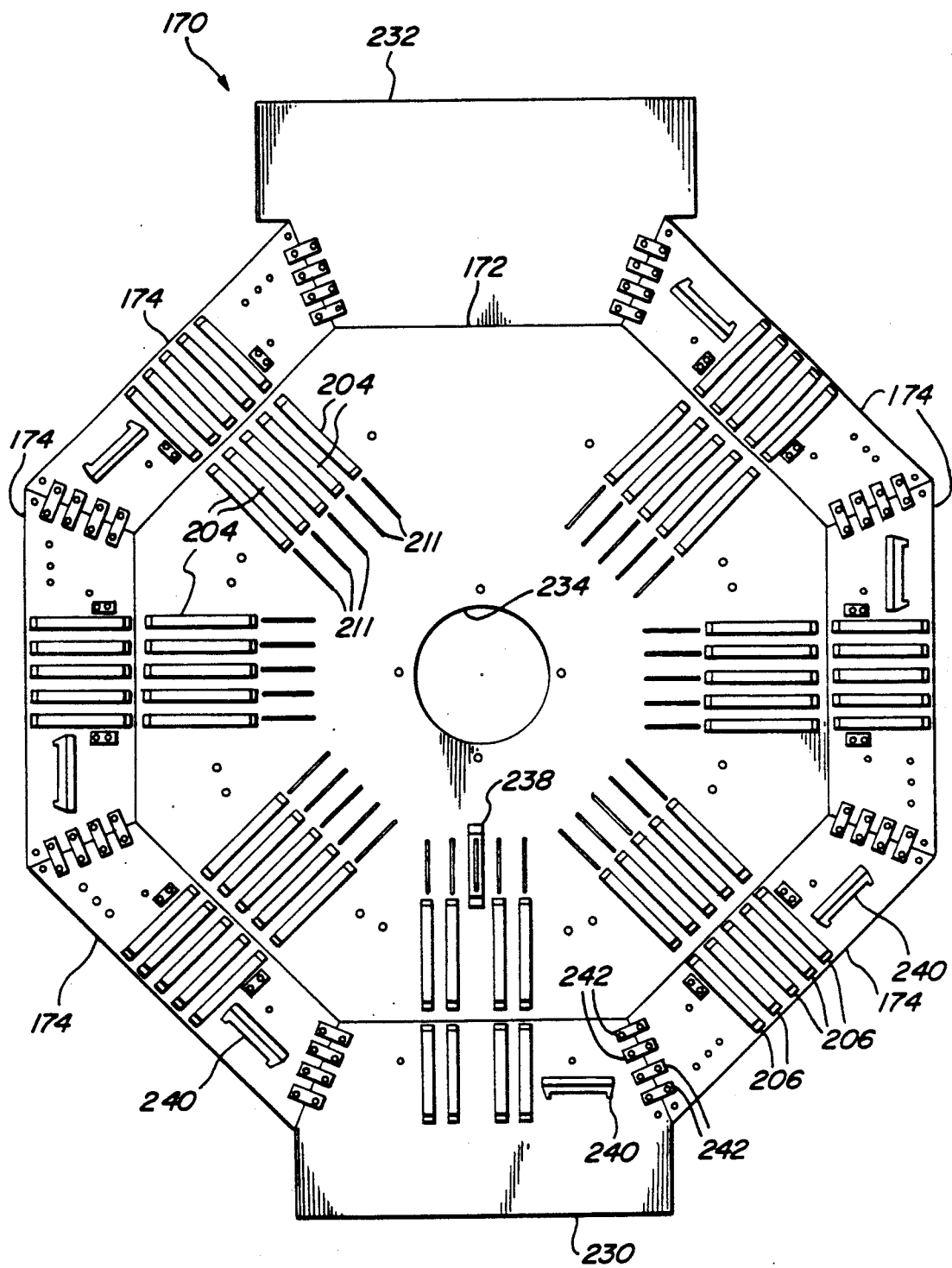
FIG. 6 is a bottom plan view of a backplane board and a plurality/of power boards.

FIG. 6 shows the backside of a preferred embodiment of the backplane assembly 170, with the backplane board 172 encircled by a sequence of power boards, including the six trapezoidal-shaped power boards 174, a B-shaped power board 230, and a T-shaped power board 232. A central backplane board aperture 234 is formed in the backplane board 172, and the plurality of edge connector slots 211 (thirty-four are shown in FIG. 6) are arranged concentrically about the backplane board aperture 234. The corresponding thirty-four backplane data connector receptacles 204 are arranged radially in an outer, concentric circle to the edge connector slots 211. An input power connector 238 is located on a radius near the edge of the backplane board 172, adjacent to the B-shaped power board 230, and is used to connect the DUT board 144 (FIG. 2) to the DUT board power supplies (not shown) located in the tester chassis 120 (FIG. 2) beneath the backplane board 172.

Five parallel backplane power connector receptacles 206 are located on the power board 174, normal to the base of the trapezoid. To one side of the receptacles 206 is a TTL bus receptacle 240, which allows digital data to be transmitted between the plurality of PE boards 160 (not shown). In the 320 pin configuration of the design verification system 100, the T-shaped power board 232 supplies the power to all the power boards 174. Also, in such a configuration, power supplies are sequestered inside the chassis underneath the fourteen backplane data connector receptacles 204 closest to the B-shaped power board 230. A plurality of bus bars 242, (thirty-two rectangular bus bars are shown in FIG. 6), are utilized to carry high current DC power between the power boards 174, the B-shaped power board 230 and the T-shaped power board 232. The entire backplane assembly 170 is bolted to the ring bracket flange 186 and rests upon the inner sidewall flange 192, as was previously discussed in reference to FIG. 3.

Figure 7:
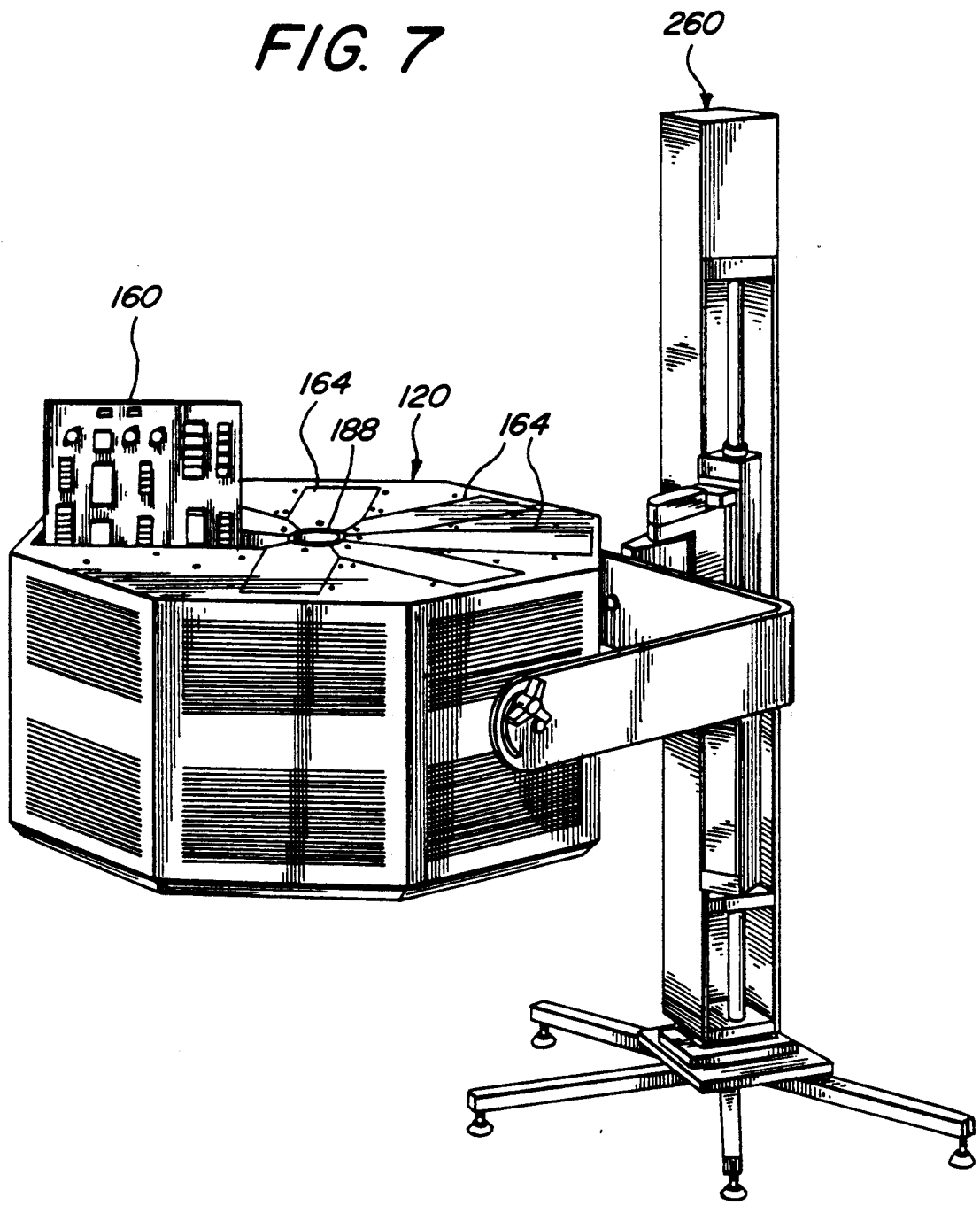
FIG. 7 is a perspective view of the design verification system shown in FIG. 1, after rotation, being held by a manipulator such that a device-under-test board is in position for undergoing microscopy, at a later time, to align a wafer with a device-under-test board; a pin electronics board is shown projecting through an access hatch opening in the design verifier chassis.

Turning now to FIG. 7, the design verification chassis 120 is shown mounted on a manipulator 260 such as, for example, that manufactured by Intest Corp. of Cherry Hill, N.J. The chassis 120 has been placed in an inverted position to expose the eight PE board access hatches 164. One of the PE boards 160 protrudes through an aperture that is normally secured by the hatch 164. In this way, PE boards 160 can be easily removed and installed for servicing without disturbing or damaging other critical electronics located inside the chassis 120.

When the chassis 120 is properly positioned with the manipulator 260, a wafer prober (not shown) may be placed under the chassis 120. A top hat assembly (not shown) may then be connected to a DUT board having a central aperture formed therein. The top hat assembly includes a plurality of pins that are used to establish electrical contact with a die on the wafer. A microscope (not shown) can be inserted down the microscopy tube 188 to accurately position the top hat assembly on the die.

The present invention thus provides an excellent electromechanical interface between PE boards, the backplane, and the DUT board, eliminating an additional interface between the PE boards and the DUT board. The cleaner signal integrity leads to more accurate test results and fewer "flaky" connections. In addition, the present design verification systems require the DUT board to be removed if one is to access the PE boards. Such DUT board removal frequently leads to cracked or otherwise broken boards. The present invention solves this problem by allowing single, specific PE boards to be selectively removed from the bottom of the tester chassis, leaving the DUT board secured in place. A further improvement of the present invention is to combine these advantages in a design verification system that can test wafers as well as chips.

While the above detailed description has shown, described, and pointed out the fundamental novel features of the invention as applied to various embodiments, it will be understood that various omissions, substitutions, and changes in the form and details of the device illustrated may be made by those skilled in the art, without departing from the spirit of the invention.

We claim:

1. A design verification system for testing integrated circuits, comprising:
   an outer housing to contain electronics designed to test integrated circuits;
   means for accepting an integrated circuit located external to said outer housing;
   means for testing said integrated circuit including driver means, receiver means, comparator means and memory means located substantially inside said outer housing but having a portion extending out of said outer housing to directly connect through a single series connector to said means for accepting so that signal integrity is improved; and
   means for transmitting signals among said means for testing located inside said outer housing above said means for testing, said means for transmitting having an opening through which said portion extending from said means for testing can project.

2. The design verification system as defined in claim 1 wherein said means for accepting includes a device-under-test (DUT) board, said means for transmitting includes a backplane assembly, and said means for testing includes a plurality of pin electronics (PE) boards.

3. The design verification system as identified in claim 2, wherein said outer housing includes an optical aperture for the insertion of an optical sensor component of an automatic wafer prober.

4. The design verification system as defined in claim 2, additionally comprising:
   a power supply which is electromechanically connected to said backplane assembly.

5. The design verification system as defined in claim 2, wherein said backplane assembly comprises:
   a polygonal backplane board; and
   a plurality of power boards each adjacent to one edge of said backplane board.

6. The design verification system as defined in claim 2, additionally comprising:
   means for mounting said outer housing on a manipulator which allows placement of said DUT board in any required orientation.

7. The design verification system as defined in claim 2 additionally comprising:
   a docking frame surrounding said DUT board and secured to said outer housing which supports a test and analysis equipment; and
   a docking plate interposed between said docking frame and said DUT board and secured to said outer housing which locks said design verification system to said test and analysis equipment.

8. The design verification system as defined in claim 2, additionally comprising:
an access plate to cover an access aperture on the opposing side of said outer housing from said DUT board whereby said PE boards and said power supply may be installed, removed or accessed from said outer housing by removing said access plate from said access aperture.

9. The design verification system as defined in claim 1, wherein:
said means for transmitting includes a first printed circuit board lying in a first plane having a slot defining a first line and a first edge connector receptacle affixed to a first face side of said first printed circuit board which is collinear to said first line;
said means for accepting including a second printed circuit board lying in a second plane parallel to said first plane with a second face side oriented in the same direction as said first face side and having a second edge connector receptacle affixed to said second face side along a second line in said second plane parallel to said first line; and
said means for testing includes a third printed circuit board lying in a third plane perpendicular to and intersecting said first and second planes along said first and second lines having a first edge connector, the length of said first edge connector being roughly the distance between said first and second planes, which is removably inserted through said slot and into said second edge connector receptacle and a second edge connector which is removably inserted into said first edge connector receptacle.

10. An electromechanical means as defined in claim 9, wherein said second printed circuit board comprises:
a backplane board to route digital data signals; and
a power board located adjacent the outer edge of said backplane board to distribute power.

11. An electromechanical means as defined in claim 9, further comprising a chassis having an aperture through which said third printed circuit board can be accessed without moving either of said first or second printed circuit boards.

12. A design verification system as defined in claim 1, wherein said outer housing includes a plurality of apertures to provide access to said means for testing without disturbing said means for accepting or said means for transmitting.

* * * * *